(12) United States Patent
Wang et al.

(10) Patent No.: US 6,856,267 B1
(45) Date of Patent: Feb. 15, 2005

(54) METHOD AND SYSTEM FOR A MULTI-RATE ANALOG FINITE IMPULSE RESPONSE FILTER

(75) Inventors: Minsheng Wang, Irvine, CA (US); Jungwoo Song, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/778,193

(22) Filed: Feb. 17, 2004

(51) Int. Cl.$^7$ ................................................ H03M 3/00
(52) U.S. Cl. ....................................................... 341/143
(58) Field of Search .......................... 341/143; 375/245, 375/243, 232, 247

(56) References Cited

U.S. PATENT DOCUMENTS 6,600,788 B1 * 7/2003 Dick et al. .................. 375/245

\* cited by examiner

*Primary Examiner*—Brian Young
(74) *Attorney, Agent, or Firm*—Sterne, Kessler, Goldstein & Fox PLLC (57) ABSTRACT

Provided are a system and method for implementing a multirate analog finite impulse response (FIR) filter. A system of the present invention includes a modulator having a first adder and a quantizer. The first adder includes an output port, and the quantizer includes (i) an input port coupled to the first adder output port and (ii) a quantizer output port. A second adder is also included, having one input port coupled to the first adder output port and another input port coupled to the quantizer output port. Also included are at least two two-unit delays, a first of the two-unit delays having an input port coupled to an output port of the second adder, and an output port coupled to an input port of the second of the two-unit delays. An output port of the second two-unit delays is coupled to a first input port of the first adder.

10 Claims, 6 Drawing Sheets

METHOD AND SYSTEM FOR A MULTI-RATE ANALOG FINITE IMPULSE RESPONSE FILTER

BACKGROUND OF THE INVENTION

1. Field of the Invention

The present invention relates generally to the conversion of digital data to analog data. More specifically, the present invention relates to the use of finite impulse response (FIR) filters in audio/voice digital-to-analog converters (DACs).

2. Related Art

Analog FIR filters are extensively used in conventional audio/voice DACs. These FIR based DACs are used, for example, as front-ends in signal processing systems where high-quality audio or voice is a desirable output. Additionally, wireless communication systems, such as the European-based Group Speciale Mobile (GSM) and the US based Code Division Multiple Access (CDMA) both widely use FIR based signal processing systems.

Conventional FIR-based DACs can include, for example, a sigma-delta ($\Sigma$-$\Delta$) modulator, an analog FIR filter, and a switched capacitor filter. In these traditional DACs, the modulator, the analog FIR filter, and the switched capacitor filter all operate at the same sampling frequency ($F_S$). In these conventional systems, the $\Sigma$-$\Delta$ modulator is considered in the art as the system's digital processing portion. Conversely, the analog filter and the switched capacitor filter are collectively considered to be the system's analog processing portion.

More advanced DACs include an additional processing feature. In the advanced DACs, for example, the analog filter operates at one-half the sampling rate of the digital portion to ease the settling time requirement to the analog filter. Settling time is defined as the time required to settle to some specific percent (e.g. 99%) of the final value. In addition to the $\Sigma$-$\Delta$ modulator, the advanced DACs can also include a multi-tap digital filter to facilitate the additional processing features. These more advanced conventional DACs, however, are inefficient from a hardware perspective. That is, many of these conventional advanced DACs include many other hardware support components that help enable the analog portion to operate at a slower sampling rate than the digital portion.

What is needed, therefore, is a more efficient approach to implement the digital portion of DACs in order to enable the analog processing portion to operate at a slower sampling rate.

SUMMARY OF THE INVENTION

Consistent with the principles of the present invention as embodied and broadly described herein, the present invention includes a modulator having a first adder and a quantizer. The first adder includes an output port, and the quantizer includes (i) an input port coupled to the first adder output port and (ii) a quantizer output port. A second adder is also included, having one input port coupled to the first adder output port and another input port coupled to the quantizer output port. Also included are at least two two-unit delays, a first of the two-unit delays having an input port coupled to an output port of the second adder, and an output port coupled to an input port of the second of the two-unit delays. An output port of the second two-unit delays is coupled to a first input port of the first adder.

The present invention provides a hardware efficient technique for implementing an analog FIR filter. By replacing the unit delays ($z^{-1}$) in the sigma-delta modulators used in conventional filter designs with two unit-delays ($z^{-2}$), the present invention eliminates the need additional hardware. More specifically, the present invention eliminates the need for the digital filters used in many of the less efficient conventional filters.

Further features and advantages of the present invention, as well as the structure and operation of various embodiments of the present invention, are described in detail below with reference to the accompanying drawings.

BRIEF DESCRIPTION OF THE FIGURES/DRAWINGS

The accompanying drawings, which are incorporated in and constitute part of the specification, illustrate embodiments of the present invention and, together with the general description given above and the detailed description of the embodiments given below, serve to explain the principles of the invention. In the drawings.

DETAILED DESCRIPTION OF THE INVENTION

The following detailed description of the present invention refers to the accompanying drawings that illustrate exemplary embodiments consistent with this invention. Other embodiments are possible, and modifications may be made to the embodiments within the spirit and scope of the invention. Therefore, the following detailed description is not meant to limit the invention. Rather, the scope of the invention is defined by the appended claims.

It would be apparent to one skilled in the art that the present invention, as described below, may be implemented in many different embodiments of hardware, software, firmware, and/or the entities illustrated in the drawings. Any actual software code with the specialized controlled hardware to implement the present invention is not limiting of the present invention. Thus, the operation and behavior of the present invention will be described with the understanding that modifications and variations of the embodiments are possible, given the level of detail presented herein.

Figure 1:
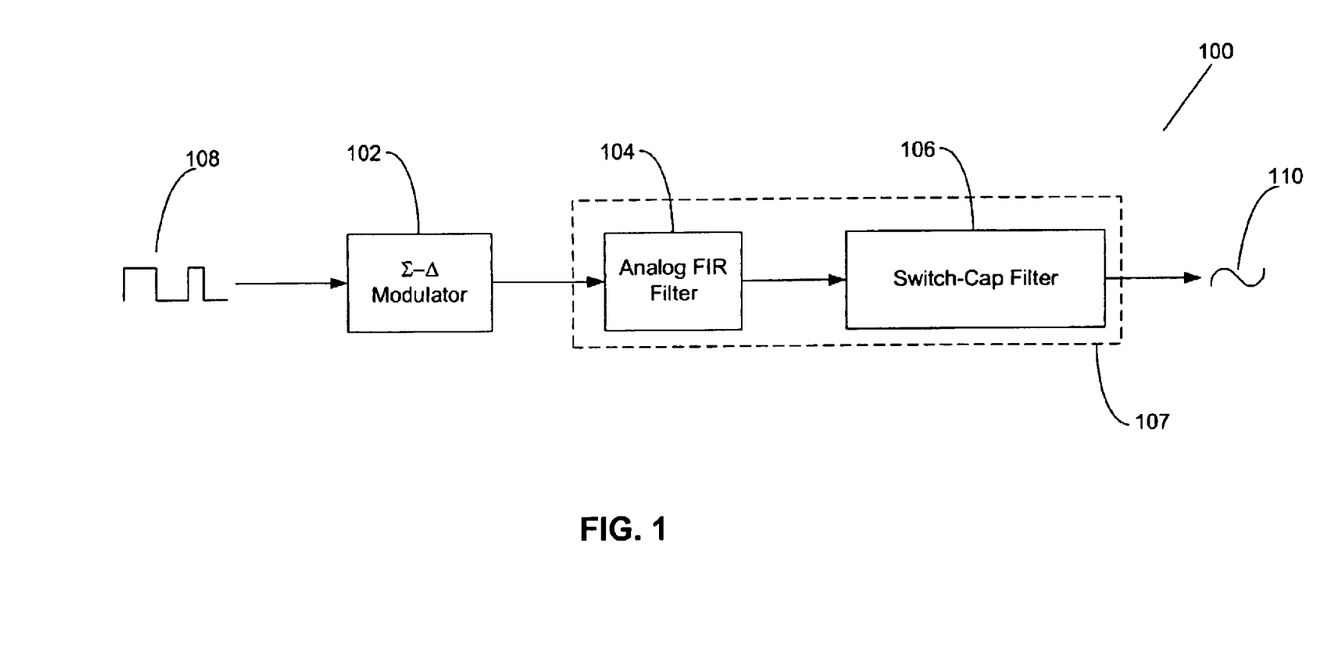
FIG. 1 is a block diagram illustration of a conventional $\Sigma$-$\Delta$ DAC.
Figure 2:
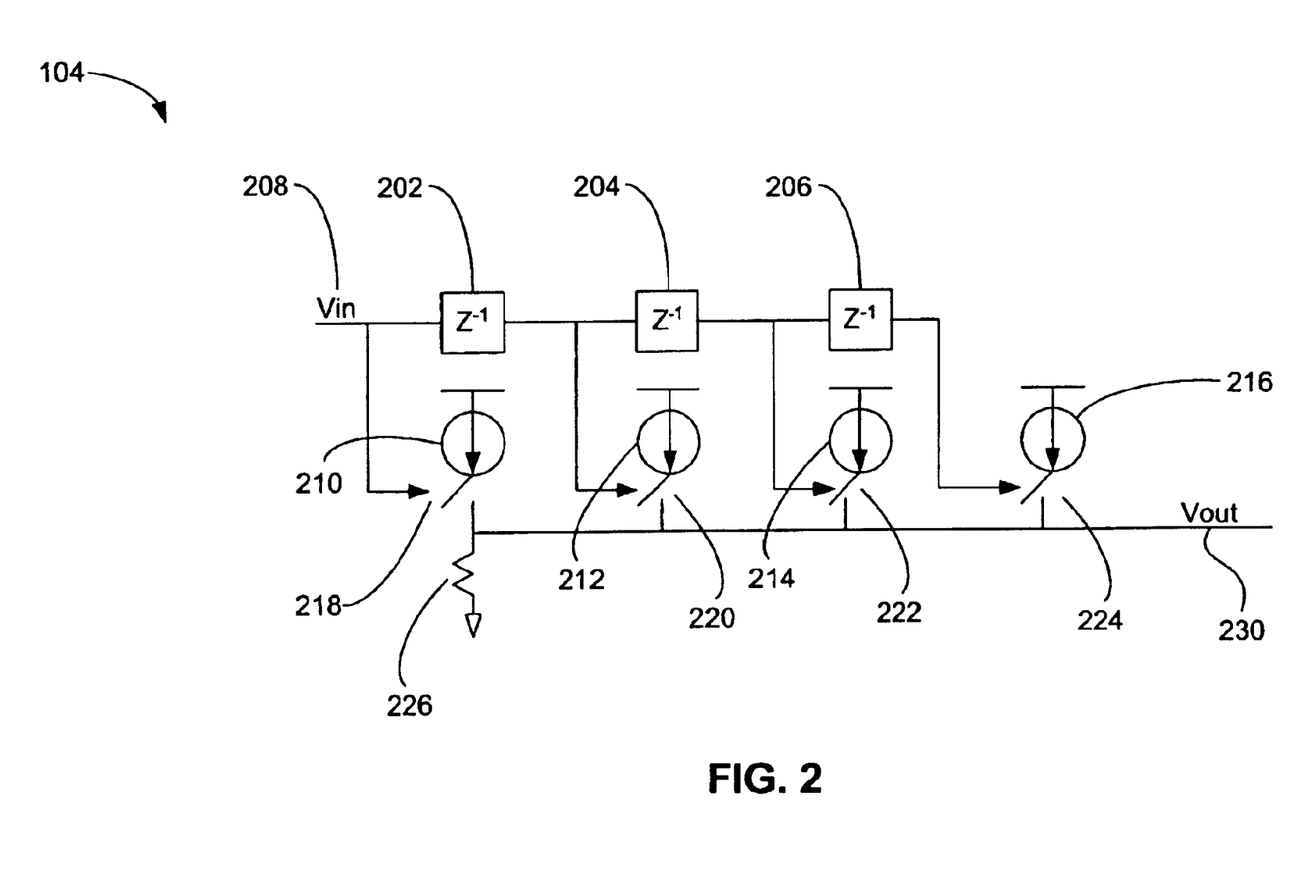
FIG. 2 is a schematic diagram illustration of the analog FIR filter shown in the illustration of FIG. 1.

FIG. 1 is a block diagram illustration of a conventional $\Sigma$-$\Delta$ DAC system 100. The DAC system 100 includes a $\Sigma$-$\Delta$ modulator 102, an analog FIR filter 104, and a switched capacitor filter 106, which provides a final level of analog filtering. The analog filter 104 and the switched capacitor filter 106 combine to form an analog processing portion 107. The $\Sigma$-$\Delta$ modulator 102 represents a digital processing portion configured to receive an input digital signal 108. The input digital signal 108 is modulated within the $\Sigma$-$\Delta$ modulator 102 and then received within the analog portion 107 to produce an output analog signal 110. FIG. 2 provides a more detailed illustration of the conventional analog filter 104.

As shown in FIG. 2, the analog filter 104 includes three 1 unit-delays 202, 204, and 206 to systematically delay the input signal. During an exemplary input cycle, the input digital signal 108, having a voltage ($V_{IN}$) 208, is received as an input to the analog filter 104. The analog FIR filter 104 also includes unit current sources 210, 212, 214, and 216. Each of the current sources is configured in line with switches 218, 220, 222, and 224, respectively. A resistor 226 is provided in line with the current source 210 and the switch 218, and operates as a summing node.

The analog FIR filter 104 shown in FIG. 2 is a simple, 1-bit analog FIR filter with the transfer function of $H_A(Z) = 1 + z^{-1} + z^{-2} + z^{-3}$. The unit elements 202, 204, and 206 switch on and off depending upon the respective state of the input digital signal 108. The idea behind the analog FIR filter 104 is that with a serial bitstream coming in, an output analog signal having a voltage $V_{OUT}$ 230, is produced as an output. The analog filter 104 provides a relatively high gain at DC and provides attenuation at higher frequencies, thus making the analog FIR filter 104 a low-pass filter.

Figure 3:
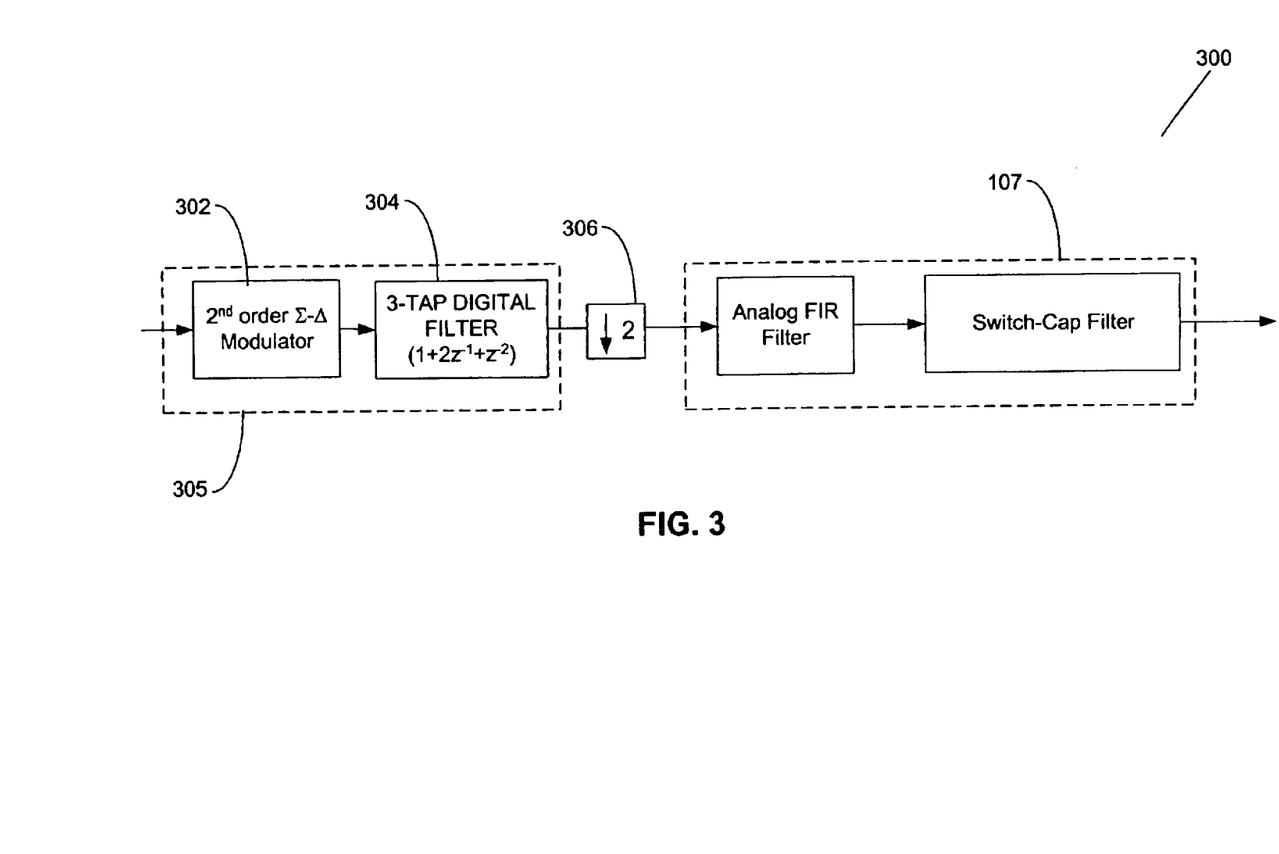
FIG. 3 is a block diagram illustration of an improved conventional $\Sigma$-$\Delta$ DAC.

FIG. 3 is a block diagram of an improved Σ-Δ DAC system 300 that includes an analog portion functioning at half the sampling rate of its digital portion. In FIG. 3, the DAC system 300 includes a second-order Σ-Δ modulator 302 and a 3-tap digital filter 304. The second-order Σ-Δ modulator 302 and the 3-tap digital filter 304 combine to form a digital processing portion 305. The 3-tap digital filter 304 has a filter transfer function of $H_D(z) = 1 + 2z^{-1} + z^{-2}$ A down-sampler 306 is provided to down-sample an output of the digital filter 304 and provide the down-sampled output to the analog portion 107. The analog processing portion 107 includes the analog FIR filter 104 and the switch-cap filter 106 discussed above with regard to FIG. 1. In FIG. 3, the combined digital portion 305 is a more sophisticated filter implementation than the Σ-Δ modulator 102 of the DAC system 100, shown in FIG. 1. For example, in FIG. 3, the input digital signal 108 is received by the second-order Σ-Δ modulator 302 and the 3-tap digital filter 304, of the digital portion 305.

More specifically, in FIG. 3, the input digital signal 108 is received at a first sampling rate and then down-sampled by a factor of two within the down-sampler 306. This process enables the analog portion 107 to run at about half the rate of the digital portion 305.. The advantage of the filter system 300 (FIG. 3) over the DAC system 100 (FIG. 1) is that in the Σ-Δ DAC 300, the analog portion 107 can work at a lower speed, therefore, ease the settling time requirement to the analog filter. Settling time is defined as the time required to settle to some specific percent (e.g. 99%) of the final value.

Although the digital portion 305 in the Σ-Δ DAC 300 provides more flexibility than other conventional filter designs, the 3-tap digital filter 304 require significant amounts of hardware to implement. This additional hardware ultimately results in the consumption of considerable amounts of space on the associated integrated circuit (IC). The additional hardware components also translate into higher overall costs.

Figure 4:
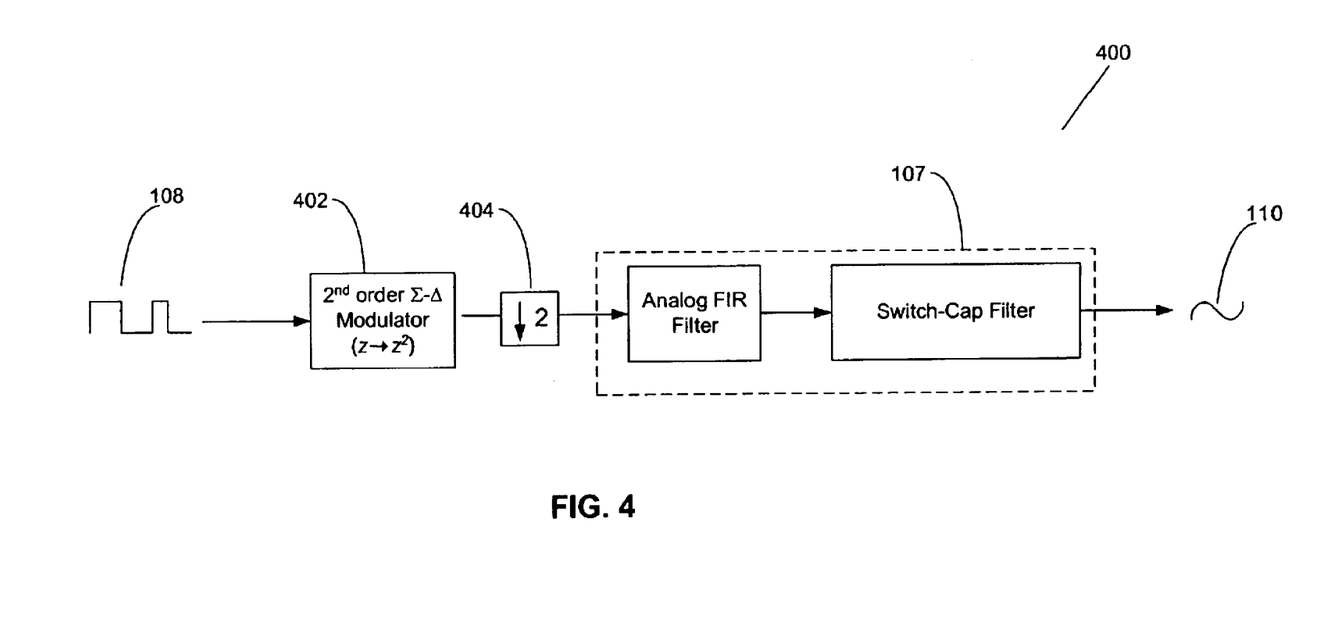
FIG. 4 is a block diagram illustration of a DAC constructed and arranged in accordance with an embodiment of the present invention.

FIG. 4 provides a block diagram illustration of a DAC system 400 constructed and arranged in accordance with an embodiment of the present invention. The DAC system 400 of FIG. 4 replaces the digital portion 305, of the filter 300 of FIG. 3, with a second-order Σ-Δ modulator 402. That is, among other things, the functions of the second-order Σ-Δ modulator 302 and the 3-tap digital filter 304 of the digital portion 305 in FIG. 3 are combined to form the second-order Σ-Δ modulator 402 shown in FIG. 4. The second-order Σ-Δ modulator 402 of FIG. 4 is a more hardware-efficient approach, and is therefore less costly than the combination of the second-order Σ-Δ modulator 302 and the 3-tap digital filter 304 of FIG. 3.

The second-order Σ-Δ modulator 402 in the embodiment of FIG. 4 is derived in the following manner. The transfer function of the second-order Σ-Δ modulator 302 of FIG. 3 can be represented by Equation 1: $H_M(z) = (1 - z^{-1})^2$. By cascading the transfer function $H_M(z)$ with the transfer function of $H_D(Z)$, yields Equation 2 as follows:

$$H_M(z) \; H_D(z) = (1-z^{-1})^2 (1+z^{-1})^2 = (1-z^{-1})^2 = H_M(z^2)$$

Equation 2 above illustrates that $H_M(z^2)$ has the same transfer function as $H_M(z)H_z(z)$. In other words, replacing the unit delay (z) in $H_M(z)$ with two unit delays ($z^{-2}$), as done in the second-order Σ-Δ modulator 402, eliminates the need for the digital filter 304 ($H_D(z)$).

Figure 5:
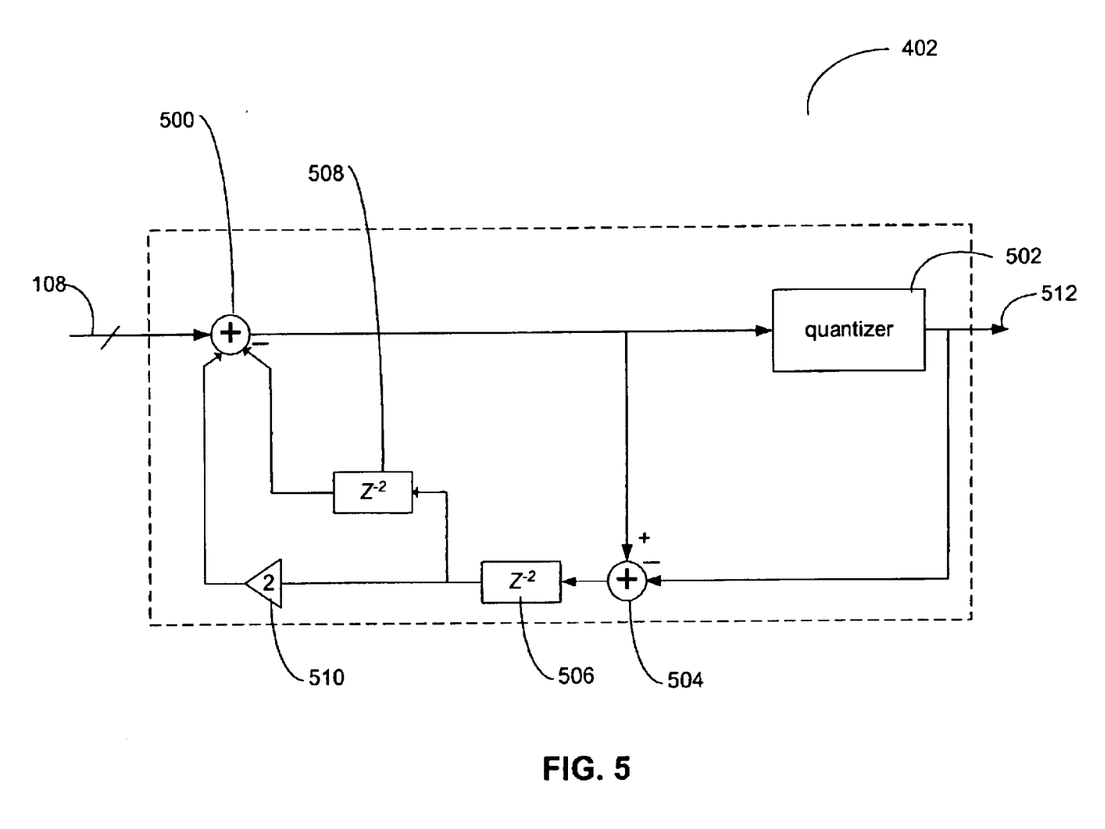
FIG. 5 is a block diagram illustration of a second-order modulator used in the illustration of FIG. 4.

FIG. 5 is a block diagram illustration of an exemplary implementation of second-order Σ-Δ modulator 402 of FIG. 4 having the two unit-delays ($z^{-2}$). In FIG. 5, the second-order Σ-Δ modulator 402 includes a adder 500 configured to receive the digital input bitstream 108. The adder 500 provides an input to a quantizer 502 and a second adder 504. The quantizer 502 of the exemplary embodiment of FIG. 5 is a nine-level quantizer, although any suitable two level or any multi-level quantizer can be used. An output of the second adder 504 is provider to a first two unit-delay 506.

The two unit-delay 506 delays a received input signal by two cycles of its system's clock (not shown). That is, the input to the two unit-delay 506 appears at the output of the two unit-delay 506, two clock cycles later. The unit delay 506 is also known in the art as a two-tap delay. An output of the two unit-delay 506 is provided to a second two-unit delay 508 and also to a "times 2" amplifier 510.

Outputs from the two unit-delay 508 and the times-2 amplifier 510 are provided to the first adder 500. In FIG. 5, one of the signal paths output from the two unit-delay 506 is amplified by a factor of 2 within the amplifier 510. The other path output from the 2 unit-delay 506 is delayed by the second two unit-delay 508.

As noted, the output of the two unit-delay 508 and the amplifier 510 are provided to the adder 500. Thus, a feedback path is formed having two feedback loops. A first feedback loop is formed from the output of the adder 500 through the quantizer 502, through the second adder 504, and then back to the adder 500. A second feedback path is formed from the output of the first adder 500 to the input of the second adder 504, and then back to the first adder 500. In the example of FIG. 5, an input signal is received, for example, a 26 MHz signal, as an input to the adder 500. The output of the adder 500 is provided as an input to the quantizer 502. The quantizer 502 ultimately produces an output signal 512, after down sampler 404, having a sampling rate of 13 MHz, for example.

The Σ-Δ modulator 402 provides a more simplified approach, when compared to the illustration of FIG. 3. More specifically, the embodiment of the present invention, as shown in FIG. 5, eliminates the need for the complicated 3-tap digital filter 304 shown in FIG. 3. Therefore, the embodiment of the present invention as illustrated in FIG. 5 provides a more hardware-efficient approach to performing Σ-Δmodulation and 3-tap digital FIR filter.

Figure 6:
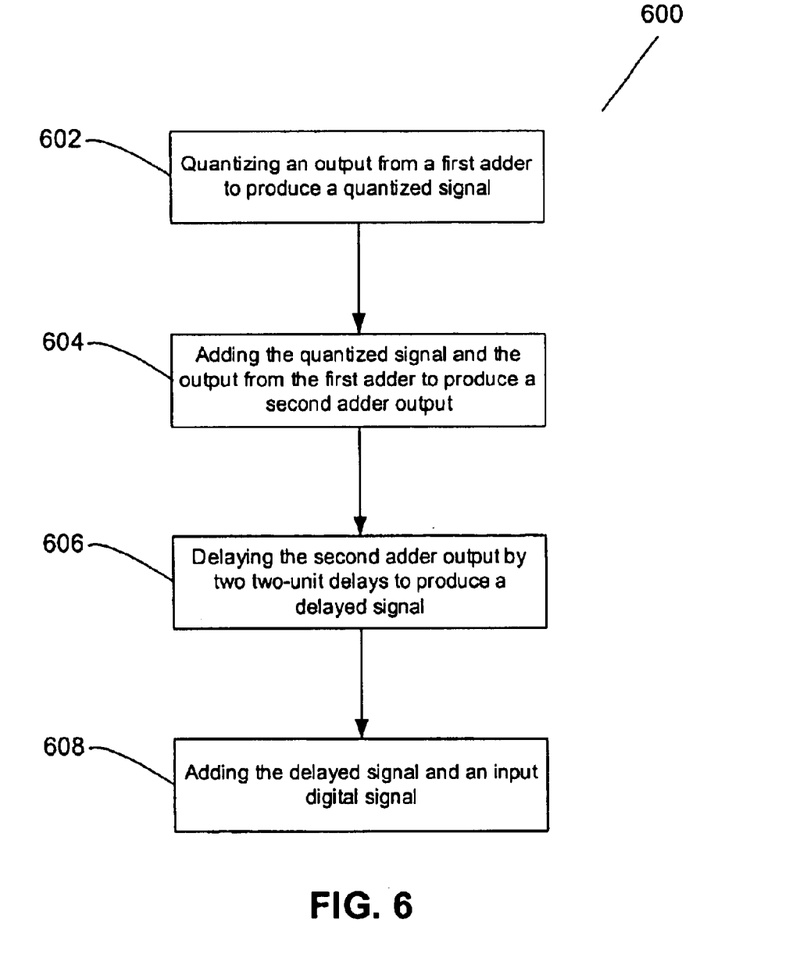
FIG. 6 is a flowchart of an exemplary method of implementing the diagram shown in the illustration of FIG. 5.

FIG. 6 is a flow chart of an exemplary method 600 of practicing an embodiment of the present invention. In FIG. 6, a signal output from the adder 500 (see FIG. 5) is quantized in order to produce a quantized signal, as indicated in step 602. In a step 604, the quantized signal and the output from the adder 500 are added to produce an output from the adder 504. The output from the adder 504 is then delayed by two two unit-delays to produce a delayed signal (step 606). Next, the delayed signal is added with an input digital signal, as indicated in step 608.

As noted above, the present invention provides a hardware efficient technique for implementing an analog FIR filter. By replacing the unit delays ($z^{-1}$) in the sigma-delta modulators used in conventional filter designs with two unit-delays ($z^{-2}$), the present invention eliminates the need additional hardware. More specifically, the present invention eliminates the need for the digital filters used in many of the less efficient conventional filters.

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed.

Any such alternate boundaries are thus within the scope and spirit of the claimed invention. One skilled in the art will recognize that these functional building blocks can be implemented by analog and/or digital circuits, discrete components, application-specific integrated circuits, firmware, processor executing appropriate software, and the like, or any combination thereof. Thus, the breadth and scope of the present invention should not be limited by any of the above-described exemplary embodiments, but should be defined only in accordance with the following claims and their equivalents.

The foregoing description of the specific embodiments will so fully reveal the general nature of the invention that others can, by applying knowledge within the skill of the art (including the contents of the references cited herein), readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one of ordinary skill in the art.

What is claimed is:

1. A modulator comprising:

a first adder having an output port;

a quantizer having an input port coupled the first adder output port and a quantizer output port;

a second adder having a first input port coupled to the first adder output port and a second input port coupled to the quantizer output port;

a first two-unit delay having an input port coupled to an output port of the second adder and an output port coupled to one input port of the first adder, forming a first feedback path; and a second two-unit delay having an input port coupled to the output port of the first two-unit delay and an output port coupled to another input port of the first adder, forming a second feedback path.

2. The modulator of claim 1, wherein the modulator has a noise transfer function of (1−z−2)2.

3. The modulator of claim 1, wherein the quantizer comprises multi-levels.

4. The modulator of claim 1, further comprising an amplifier coupled between the output of the first two-unit delay and the first adder.

5. The modulator of claim 4, wherein the amplifier is a times two amplifier.

6. A modulator comprising:

a first adder configured to receive an input signal and produce a first adder output therefrom;

a quantizer configured to receive the first adder output and produce a quantized output;

a second adder configured to receive the first adder output and the quantized output and produce a second adder output based upon the first adder output and the quantized output;

a first two-unit delay configured to receive the second adder output as an input and produce a delayed output therefrom, the delayed output being provided as one input to the first adder forming a first feedback path; and a second two-unit delay configured to receive the delayed output and provide a second two unit-delay output to another input of the first adder, forming a second feedback path.

7. A method for modulating a signal, comprising:

quantizing a first added signal to produce a quantized signal;

adding the quantized signal and the first added signal to produce a second added signal;

delaying the second added signal two clock cycles along a first feedback path to produce a first delayed signal;

delaying the second added signal by four clock cycles alone a second feedback path to produce a second delayed signal; and substantially simultaneously adding the first delayed signal, the second delayed signal, and an input digital signal.

8. The method of claim 7, further comprising amplifying the second delayed signal.

9. The method of claim 8, wherein the amplification includes signal by a factor of two.

10. The method of claim 7, wherein the quantizing includes multi-level quantizing.

* * * * *

UNITED STATES PATENT AND TRADEMARK OFFICE
CERTIFICATE OF CORRECTION

PATENT NO. : 6,856,267 B1
DATED : February 15, 2005
INVENTOR(S) : Minsheng Wang et al.

It is certified that error appears in the above-identified patent and that said Letters Patent is hereby corrected as shown below:

Column 5,
Line 53, "an input port coupled the first adder" should appear as -- an input port coupled to the first adder --

Column 6,
Line 10, "transfer function of (1-z-2)2" should appear as -- transfer function of $(1-z^{-2})^2$ --
Line 54, "includes signal by a factor of two" should appear as -- includes amplifying the delayed signal by a factor of two --

Signed and Sealed this

Fourteenth Day of June, 2005

JON W. DUDAS
*Director of the United States Patent and Trademark Office*